United States Patent
Bienek et al.

(10) Patent No.: US 8,045,933 B2
(45) Date of Patent: *Oct. 25, 2011

(54) MOBILE PHONE TERMINAL WITH PROGRAMMABLE MICROELEMENTS

(75) Inventors: Bernd Bienek, Bocholt (DE); Dietmar Gapski, Bocholt (DE); Klaus-Dieter Pillekamp, Erkrath (DE); Xihe Tuo, Duisburg (DE)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/491,509

(22) Filed: Jun. 25, 2009

(65) Prior Publication Data

US 2009/0325564 A1    Dec. 31, 2009

Related U.S. Application Data (63) Continuation of application No. 09/787,868, filed as application No. PCT/DE99/03079 on Sep. 24, 1999, now Pat. No. 7,570,943.

(30) Foreign Application Priority Data

Sep. 25, 1998  (DE) .................... 198 44 142
Sep. 25, 1998  (DE) .................... 198 44 143
Apr. 28, 1999  (DE) .................... 199 19 368

(51) Int. Cl.
    *H04B 1/44*     (2006.01)
    *H04B 1/18*     (2006.01)
    *H04W 88/02*    (2009.01)

(52) U.S. Cl. ............ 455/79; 455/83; 455/68; 455/419; 455/193.1; 455/123

(58) Field of Classification Search ............ None
     See application file for complete search history.

(56) References Cited

U.S. PATENT DOCUMENTS 6,091,765 A * 7/2000 Pietzold et al. ........... 455/418 X
7,570,973 B1 * 8/2009 Bienek et al. .............. 455/557

FOREIGN PATENT DOCUMENTS

DE    3010707 A1 * 9/1981

* cited by examiner

*Primary Examiner* — Philip Sobutka (57) ABSTRACT

Mobile phone terminal, having a transmitter stage, a receiver stage and an antenna switch-over and adapter stage which each have an arrangement of passive structural elements, which arrangement is assigned a multiplicity of electrostatic-mechanical microswitches or microrelays and which can be programmed by actuating a predetermined configuration of the microswitches or microrelays in, in each case, at least one functional parameter, in particular the frequency characteristic, and a programmable control unit.

13 Claims, 11 Drawing Sheets

MOBILE PHONE TERMINAL WITH PROGRAMMABLE MICROELEMENTS

RELATED APPLICATIONS

This application is a continuation (and claims the benefit of priority under 35 USC 120) of U.S. application Ser. No. 09/787,868, filed Oct. 18, 2001 (now U.S. Pat. No. 7,570,973, issued Aug. 4, 2009), which claims priority as a U.S. National Stage of Application No. PCT/DE99/03079, filed Sep. 24, 1999 and claims further priority to German Application Nos. 199 19 368.1 (filed Apr. 28, 1999), 198 44 143.6 (filed Sep. 25, 1998) and 198 44 142.8 (filed Sep. 25, 1998). The disclosures of the prior applications are considered part of (and are incorporated by reference in) the disclosure of this application The invention relates to a mobile phone terminal having a transmitter stage, a receiver stage and an antenna switch-over and adapter stage, which each have an arrangement of passive structural elements and can be programmed in, in each case, at least one functional parameter. The invention also relates to a programmable mobile phone filter circuit and a programmable mobile phone RF block.

Mobile phone terminals are, as far as their telecommunications part is concerned, mobile phone receiver and transmitter stations which operate in the microwave range. The use of operating frequencies near or in the gigahertz range (for example approximately 900 MHz in the GSM system and approximately 1800 MHz in the DCS system) causes complicated propagation conditions to be decisive for their operation, the consequences of which conditions—in particular very severely fluctuating fading over time as a result of superimposition and multipath reception—make it necessary to take particular care when designing equipment. Although the most important measures for dealing with the problems which are encountered on the propagation path (the so-called "air interface") are in the field of digital signal processing, the design of the RF components is, however, also highly significant in terms of ensuring the necessary transmission quality.

In this context it is desirable to embody essential functional parameters of the RF sections in such a way that they can be adjusted very quickly over a relatively large range in a way which is easy and adapted to the overall design of the mobile phone terminal. Comprehensive programmability of the RF sections is considered to be ideal, but the practical embodiment of the RF sections of mobile phone terminals is far removed from such programmability. It is currently restricted to the possibility of switching a function block on and off, controlling the output power or amplifying a block by means of changes in bias voltages or currents or the like.

In mobile phone devices according to the prior art there is practically no possibility of changing or programming the electronic components such as the RF blocks or filter circuits, for example. However, in order to provide so-called software-defined mobile phones or the like, the electronic or electrical components in the mobile phone must be as freely programmable as possible, and this programmability should also still be present after the final fabrication of the mobile phone device. Furthermore, because, as is known, components with small dimensions, high linearity and low power consumption are desirable in mobile phone applications, products which are based on a yig, pin-diode or varactor technology have corresponding disadvantages.

In particular, the filters and duplexers used in mobile phone devices should therefore have small dimensions, low power consumption, high linearity and furthermore be as freely programmable as possible.

The invention is based on the object of making possible a mobile phone terminal which is improved with respect to the aspect of the programmability of the essential functional parameters of the RF sections.

This object is achieved by means of features of the independent claims.

The invention includes the essential idea of providing a microswitch arrangement or microrelay arrangement in each of the RF transmitter stage, RF receiver stage and the antenna switch-over and adapter stage, that is to say the essential RF components, with which arrangement the passive structural elements which are contained there and which determine specific functional parameters can be configured in a predetermined fashion from subelements.

Such microswitches or microrelays are known in various embodiments from U.S. Pat. No. 5,619,061, in which their application for tuning a filter circuit or for antenna selectivity tuning is also mentioned.

An embodiment in which at least one of the aforesaid RF components also has micromotors for mechanically adjusting passive structural elements is preferred, the micromotors likewise having a control connection to a control unit by means of which the microswitches and microrelays are actuated. The configuration of the structural elements, determining the characteristic values, of the respective RF component can be optimized further in terms of overall volume, power consumption, linearity and expenditure on actuation by means of the combined use of a microswitch arrangement and of adjustment motors.

In order to reduce the overall size and the manufacturing expenditure, it is advantageous to adopt an embodiment in which at least some of the microswitches and relays and, if they are additionally provided, micromotors are integrated with the passive structural elements influenced by them on a common substrate. A ceramic substrate with a high dielectric constant is particularly suitable for this.

The passive structural elements which are subdivided into subelements form, together with the microswitches connecting the subelements, a topology which is expediently stored in a topology memory of the control unit. Furthermore, in one preferred embodiment, the control device comprises an algorithm memory for storing a calculation algorithm for the functional parameter or parameters to be programmed, and a calculation stage for calculating the active topology which supplies a predetermined value of the respective functional parameter. By means of appropriate comparator means it is possible to acquire a switching matrix directly from a comparison of the calculated active topology with the totality of the topology present, which switching matrix is then implemented by transmitting appropriate switching control signals to the individual microswitches.

In one modified embodiment the control unit comprises a multirange configuration memory (in the manner of a so-called "lookup table") for storing a multiplicity of microswitch switching matrices with the topology implemented in the RF section, in each case in an assignment to a value of a functional parameter or a values vector of a plurality of functional parameters, and a pointer stage for addressing the configuration memory, which pointer stage responds to the inputting (programming) of such a value or values vector.

If micromotors are additionally present, both aforesaid ways of implementing the invention are possible with a somewhat increased expenditure on memory, or memory and processing. The sections of the structural element arrangement which are influenced by micromotors are advantageously subdivided here into (virtual) subelements corresponding to the motor settings which can be implemented, and their structure can thus be stored and handled in a fashion analogous to a structure of real subelements separated from one another by microswitches.

In particular, the frequency characteristic of the respective RF component is to be regarded as a functional parameter which is to be set in discrete increments (by activating the microswitches and optionally micromotors). Capacitors and/or inductors and/or microstrip line sections or else resonators are provided as passive structural elements to be switched. These all basically exhibit linear characteristics with the result that, in comparison with influencing the frequency characteristic by means of active structural elements such as varactors or transistors, there is no risk of any nonlinearities or distortions. In addition, the electrostatically controlled microswitches do not have any power drain.

For the concrete setting process, a specific procedure is to be observed in order to protect the microswitches, and if appropriate micromotors or else other parts of the arrangement, against overcurrents and voltage peaks. To do this, the RF component which is to be adjusted and preferably the entire RF section are switched to an inactive state. Subsequently, the currently required microswitch configuration or the combination of microswitch configuration and micromotor actuation which is to be implemented can be determined in one of the ways sketched above. Finally, the predetermined switch configuration or combination of switch setting/motor actuation is implemented by means of the control unit, and last of all the RF components or the entire mobile phone terminal are changed into the active state again. A functionality (programming) of the control unit which implements the sequence automatically corresponds of course to the procedure described here.

According to a further aspect, a programmable RF block is provided for mobile phone applications. This programmable RF block has at least one active component and at least one mechanically tunable adapter network which has individually adjustable passive components and is connected to the active component. Furthermore, a programmable control unit is provided which sets the mechanically tunable adapter network in such a way that all the properties of the RF block relating to its signal response characteristic are predetermined.

Each adjustable passive component can be assigned an electric micromotor here, with the result that the programmable control unit can perform the adjustment of the mechanically tunable adapter network by actuating the micromotors.

The micromotors are activated here only during the period of adjustment of the mechanically tunable adapter network, whereas, outside the aforesaid period, the supply of electricity to the micromotors is switched off by, for example, the programmable control unit in order to reduce the power consumption, which is important in particular in mobile phone applications.

According to a further aspect of the present invention, a programmable filter circuit is provided for mobile phone applications, said filter circuit having a plurality of passive components whose characteristic values are each mechanically adjustable. These passive components are wired according to filter circuit topologies which are well known from the prior art. Furthermore, electric micromotors are provided for mechanically adjusting the passive components. These electric micromotors are actuated by a programmable control unit in such a way that the filter circuit has a characteristic curve which is predetermined in its entirety.

The control unit can be connected here to a memory in which setting values of the passive components or actuation values for the corresponding electric micromotors and/or characteristic curves of the filter circuit are stored, for example in the form of a table.

Alternatively or in addition, the control unit itself the control unit itself can calculate the actuation values for the electric micromotors which are to be transmitted in order to achieve a specific characteristic curve of the filter circuit.

At least some of the passive components can be capacitors which have a mechanically adjustable capacitance, the capacitors being constructed with a high dielectric constant using a ceramic technology for the sake of small dimensions.

The capacitors can have, for example, rotatable or slidable metal plates which are moved by the electric micromotors in order to adjust their capacitance values mechanically.

Some of the passive components may be resonators, it being possible to change the position of a short-circuit conductor with respect to a grounding point by means of the corresponding electric micromotor in order to mechanically adjust the characteristic values (tuning) of the resonators.

In order to save energy, the electric micromotors can be actuated in such a way that they are supplied with electric power only during the period in which a corresponding, assigned passive component is being mechanically adjusted.

According to the present invention, a programmable duplexer is also provided for mobile phone applications which has a plurality of programmable filter circuits according to one of the preceding claims, the programmable filter circuits being adjusted by the control unit in such a way that they have different frequency characteristic curves.

Advantages and expedient aspects of the invention are, for the rest, apparent from the subclaims and the following description of preferred exemplary embodiments with reference to the figures, in which:

Figure 1:
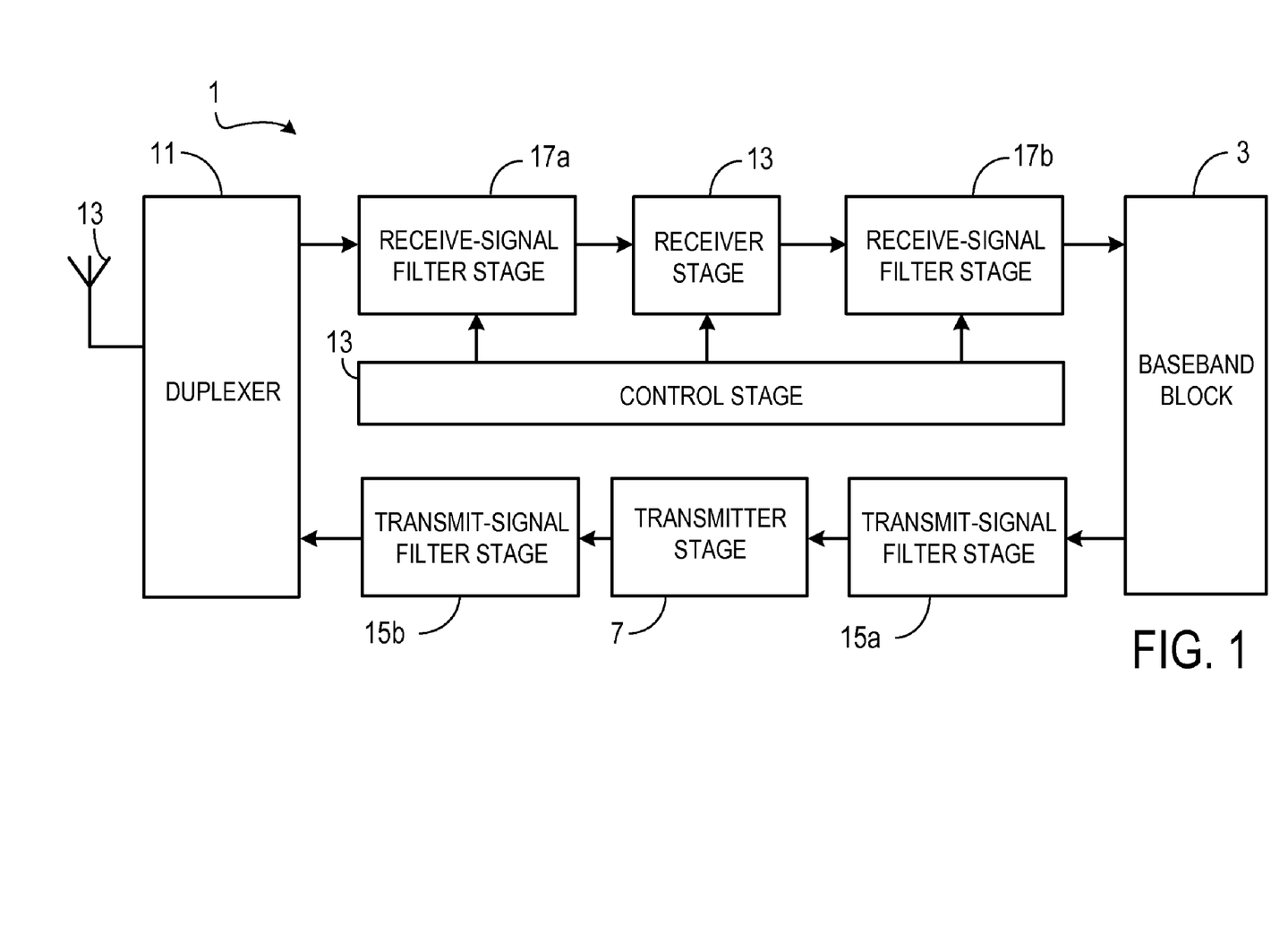
FIG. 1 shows a highly simplified functional block circuit diagram of a mobile phone terminal for explaining the invention with reference to an embodiment.

FIG. 1 shows a highly simplified basic sketch of a mobile phone terminal 1 which has a baseband block 3 which comprises, in particular, the low-frequency components and voice signal processing means, a receiver stage 5, a transmitter stage 7, a control section 9, a duplexer 11 and an antenna 13. Provided in the transmitter-end signal path is, in each case, a tunable transmit-signal filter stage 15a, 15b between the baseband block 3 and the transmitter stage 7, and between the latter and the duplexer 11, respectively, and in each case a tunable receive-signal filter stage 17a, 17b is provided in the receiver-end signal path between the duplexer 11 and the receiver stage 5, and between the latter and the baseband block 3, respectively.

In summary, the receiver stage 5 and the associated receive-signal filter stages 17a, 17b can also be referred to as a receiver stage in the broader sense, and the transmitter stage 7 together with the transmit-signal filter stages 15a, 15b can be referred to as a transmitter stage in the broader sense. In a somewhat different way of considering the components, the tunable filter stages 15b and 17a could also be apportioned to the duplexer 11, and this combined functional unit could be referred to as an antenna switch-over and adapter stage. Insofar as the baseband block has (means known per se) for source coding, channel coding and interleaving as well as burst formation at the transmitter end and corresponding deinterleaving, channel decoding and source decoding means at the receiver end, there is a close functional connection to the control section, which of course has means for controlling the functional sequences of the mobile phone terminal which conform to the respective mobile phone system standard. In the context of explaining the invention, the control functions of the control section 9 relating to the receiver stage 9, the transmitter stage 7 and the filter stages 15a, 15b and 17a, 17b are particularly important. For this reason, they will be explained in more detail below.

Figure 2A:
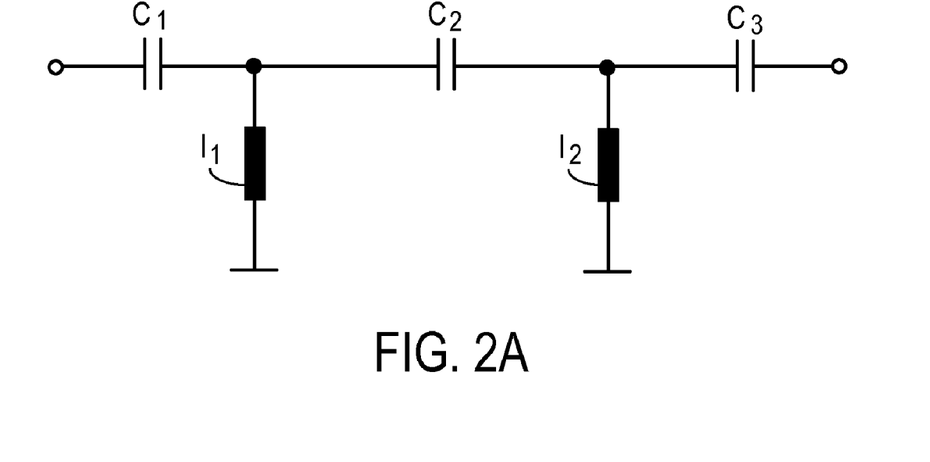
FIG. 2a shows a basic circuit diagram of a resonator circuit such as is used in one of the filter modules or in the duplexer of the mobile phone terminal according to FIG. 1, FIGS. 2b to 2e show various ways of implementing the circuit according to FIG. 2a according to embodiments of the invention using microswitches or microrelays.

FIG. 2a shows a resonator arrangement composed of three capacitors C1, C2 and C3 which are connected in series, and two inductors 11, 12 which connect the line section between the capacitors C1, C2 and the section between the capacitors C2, C3 to ground. Such a resonator arrangement is implemented in the filter stages 15a, 15b, 17a and 17b and/or the receiver stage and the transmitter stage in the broader sense and/or the antenna switch-over and adapter stage.

Figure 2B:
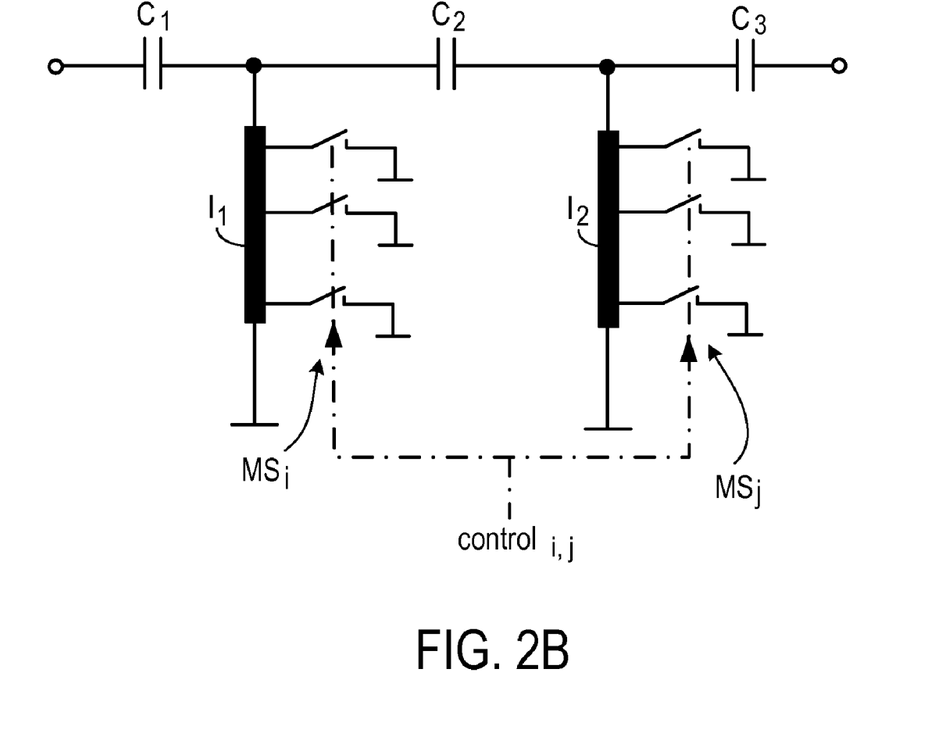

FIG. 2b shows in sketch form that the inductors 11, 12 of the arrangement according to FIG. 2a each have a multiplicity of taps, which can each be connected to ground via one microswitch, in a predetermined arrangement. The microswitches which are assigned to the inductor 11 are designated by $MS_i$ in the figure and are actuated individually by means of "$control_i$" control signals, while the microswitches assigned to the inductor $l_2$ are designated by $MS_j$ and are actuated by means of "$control_j$" control signals. The microswitches $MS_{i,j}$ separate off—depending on the switch setting—more or less large parts of the inductors 11, 12, with the result that the frequency characteristic of the resonator arrangement can be adjusted by means of their actuation.

Figure 2C:
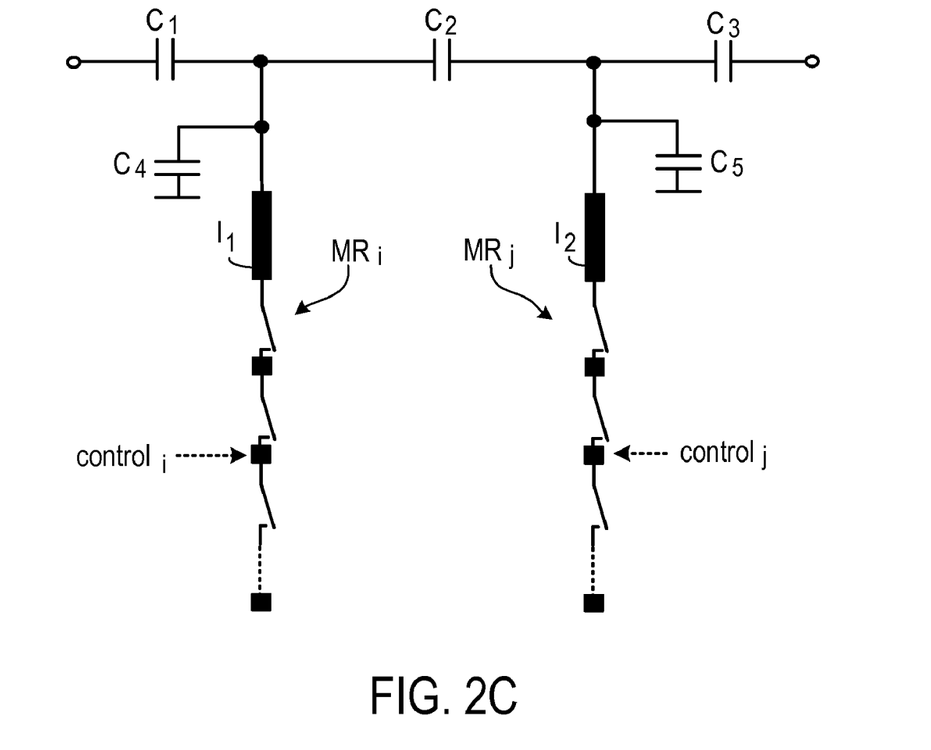

A somewhat modified embodiment of this principle is shown in FIG. 2c, where the inductors 11, 12 are each divided into subinductors by a group of microrelays $MR_i$ and $MR_j$, actuated by actuation signals "$control_i$" and "$control_j$". This circuit in which two grounding capacitors C4, C5 are also provided, constitutes an open circuit, while the embodiment according to FIG. 2b can be considered to be a short circuit.

Figure 2D:
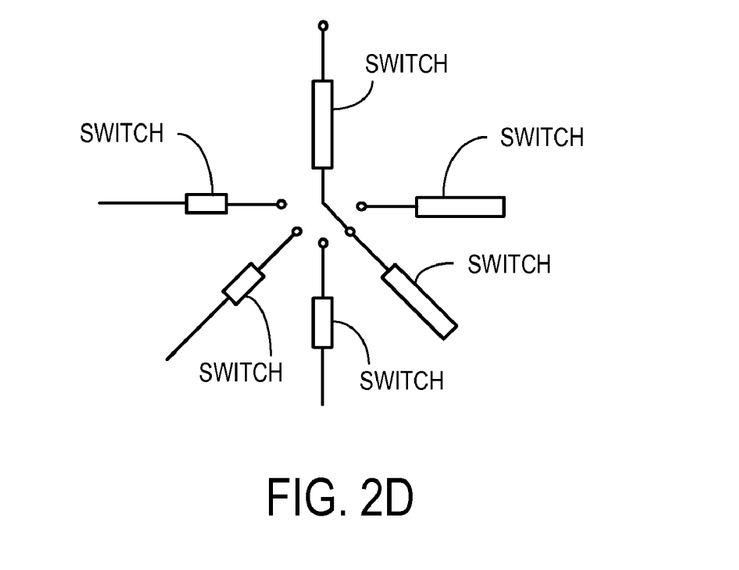
Figure 2E:
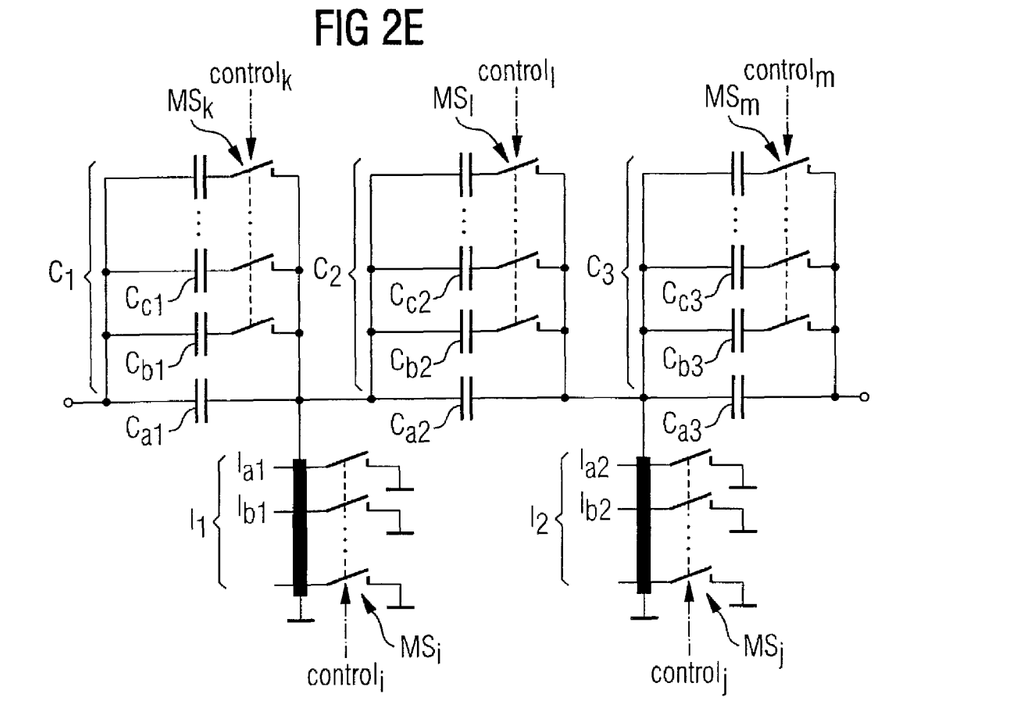

FIG. 2d shows a star-shaped switch configuration which can take the place of the serial switch arrangement according to FIG. 2b or 2c. FIG. 2e shows an arrangement which is modified with respect to FIG. 2b insofar as here not only the inductors 11, 12 but also the capacitors $C_1$, $C_2$ and $C_3$ are divided into substructural elements by means of microswitches and can be tuned by activating the switches. In accordance with the representation in FIG. 2b, the switches assigned to the capacitors C1 to C3 are designated by $MS_k$, $MS_l$ and $MS_m$ and the associated control signals are correspondingly designated by "$control_k$", "$control_l$" and "$control_m$". The subinductors of 11 are designated here by $l_{a1}$, $l_{b1}$, ... and those of 12 are designated by $l_{a2}$, $l_{b2}$, ..., and in an analogous fashion the subcapacitors of the capacitors C1 are designated by $C_{a1}, C_{b1}, C_{c1}, \ldots$, those of the capacitor C2 are designated by $C_{a2}, C_{b2}, C_{c2}$, and those of the capacitor C3 are designated by $C_{a3}, C_{b3}, C_{c3}, \ldots$. This figure shows particularly clearly that as a result of the subdivision of passive structural elements of a filter range or adaptation range into substructural elements by means of microswitches or microrelays
a topology is developed which comprises a large number of configurations which can be implemented by actuation of switches in specific ways.

Figure 2F:
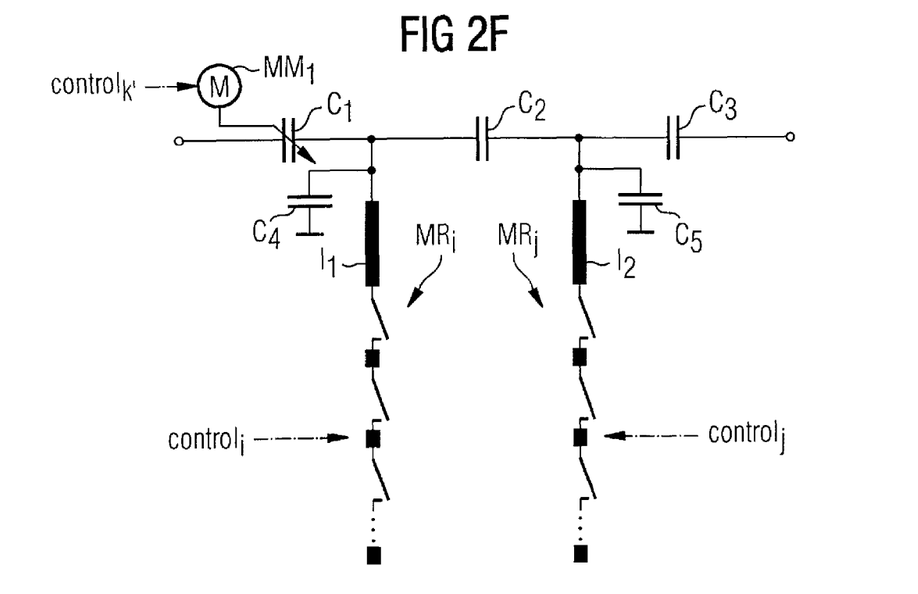
FIGS. 2f and 2g show modified embodiments of a tunable resonator circuit in which not only microrelays or microswitches but also micromotors are provided.

FIG. 2f shows an embodiment which is modified with respect to FIG. 2c in such a way that the capacitance of the capacitor C1 can be changed by a micromotor $MM_1$, actuated by a "$control_k$" control signal. Of course, the capacitors C2 and C3 can also be embodied so that they are adjustable by appropriately actuating a micromotor which is assigned to them.

Figure 2G:
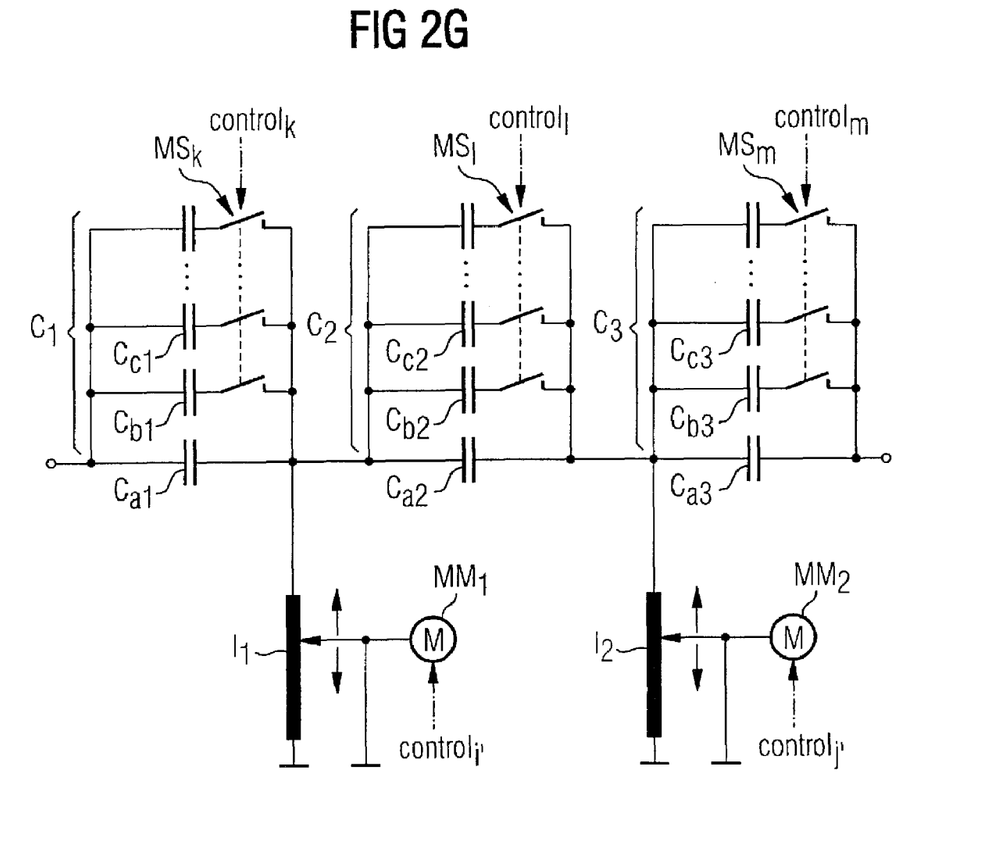

In the arrangement according to FIG. 2g, the arrangement shown in FIG. 2e with capacitors C1, C2 and C3 subdivided into subcapacitors is modified with respect to the inductors in such a way that the latter each have a ground tap which can be displaced by means of a micromotor $MM_1$ or $MM_2$. By analogy to FIG. 2e, the corresponding control signals have been designated here by "$control_i$" and "$control_j$".

Figures 3, 4:
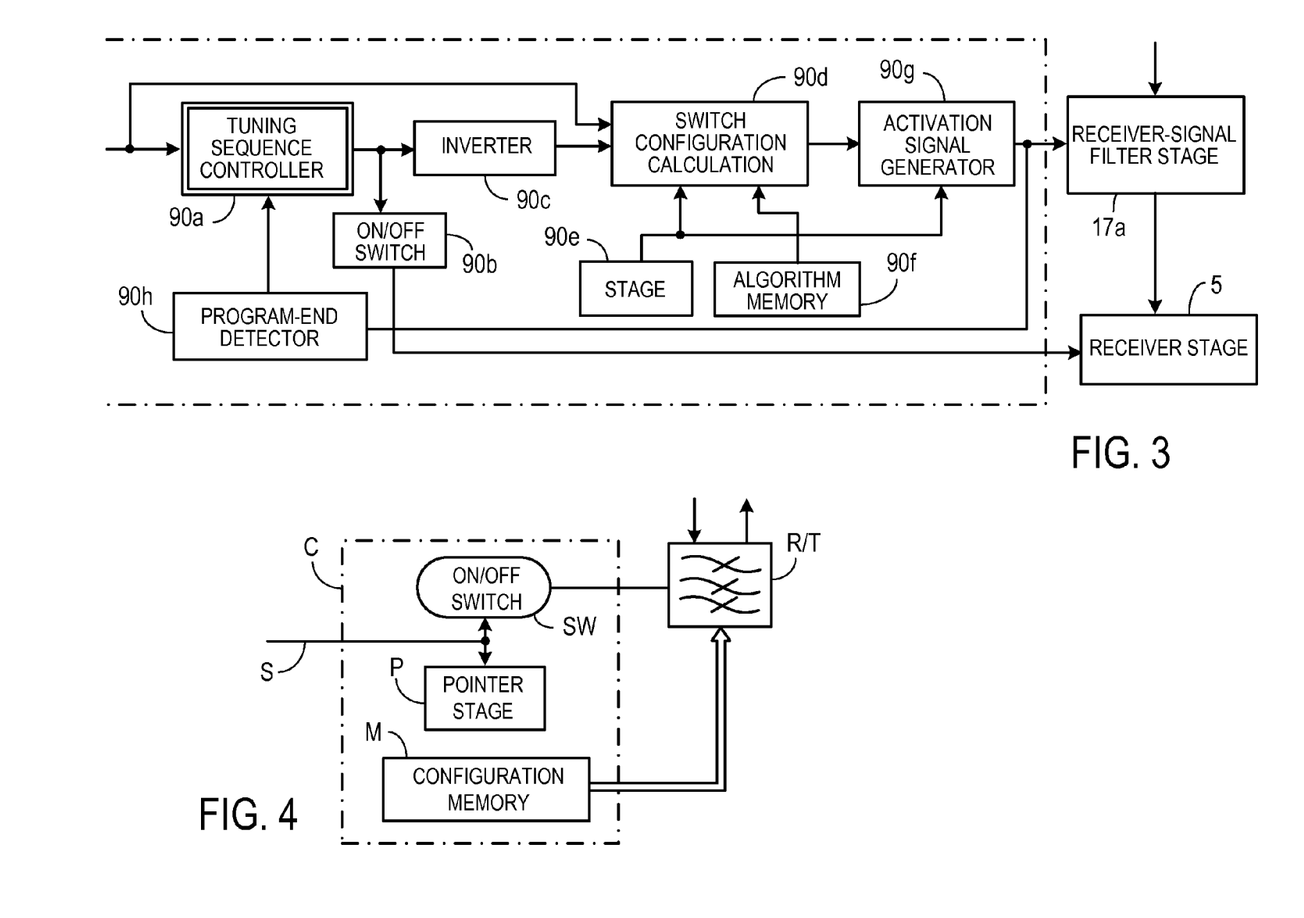
FIG. 3 shows a functional block circuit diagram of a control arrangement for tuning a filter stage of the mobile phone terminal according to FIG. 1.
FIG. 4 shows a sketch of the control system according to a further embodiment.

FIG. 3 shows, in the manner of a functional block circuit diagram, a sketch of the design of a tuning controller 90 (whose reference number has been based on the control section 9 from FIG. 1) for tuning a receive-signal filter stage 17a according to FIG. 1. The tuning controller 90 comprises a tuning sequence controller 90a which receives a signal which is supplied externally and which represents a requested frequency characteristic of the receive-signal filter stage 17a.

The tuning sequence controller 90a is connected to the receiver state 5 via an on/off switch 90b via which it firstly switches off the receiver stage 5 when the aforesaid signal, on the basis of which the receive-signal filter stage 17a is to be tuned, is received. The signal generated for the activation of the on/off switch is also fed via an inverter 90c to a switch-configuration calculation stage 90d and activates it, after which said switch-configuration calculation stage 90d receives and buffers the abovementioned signal which specifies a frequency characteristic and is also applied to its output.

By accessing a topology memory 90e, in which the specific filter topology of the receiver filter stage 17a is stored, said topology being formed from the passive structural elements or subelements and assigned microswitches or microrelays and, if appropriate, micromotors, and accessing an algorithm memory 90f in which a corresponding algorithm for determining the specific switch configuration on the basis of a predetermined frequency characteristic is stored, the switch-configuration calculation stage 90d calculates the actuation configuration of the microswitches or relays, and if appropriate micromotors, which is to be implemented on the basis of the requested frequency characteristic, and transmits said configuration to an actuation signal generator 90g. The latter generates—also by accessing the topology memory 90e—the actuation signals for each individual switch of the entire configuration from this and feeds them sequentially to the receive-signal filter stage 17a. The transmission of the last actuation signal is sensed by a program-end detector 90h which transmits a corresponding signal to the tuning sequence controller 90a, which then activates the on/off switch 90b in order to switch the receiver stage 5 on again, and deactivates the switch-configuration calculation stage 90d. (The functions described here will for the most part be implemented in practice using software so that the description given here using functional blocks is to be understood only as an illustration of the principle).

FIG. 4 shows in sketch form (in a somewhat different form of representation) an alternative embodiment of the control system. A control unit C comprises a configuration memory M in which a predetermined quantity of switch-setting configurations of a structural element/microswitch arrangement of a RF section R/T of a mobile phone terminal is stored in an assignment to, in each case, one frequency characteristic from a predetermined set of frequency characteristics. An input signal line S of the controller C is connected on the one hand to
an on/off switch Sw and on the other hand to a pointer stage P, which can itself address the configuration memory M.

When an instruction signal for setting a predetermined frequency characteristic on the signal line S is received, the RF section R/T is placed in a default mode by means of the on/off switch Sw, and on the other hand the pointer P for addressing the configuration memory M is activated in accordance with the requested frequency characteristic. The memory contents are read out to the RF section and appropriate setting of the microswitch arrangement is performed there. After its termination, the RF section is activated again—in accordance with the embodiment according to FIG. 3.

The embodiment of the invention is not restricted to the exemplary embodiments described here, but is also possible in a large number of refinements. In particular, resistors can also be subdivided as passive structural elements by means of microswitches or microrelays into subelements and in this way, in particular, impedance adaptations can be performed. In this context the use of microstrip lines is particularly expedient for many applications. A combination of microswitches with micromotors can also be expedient with passive structural elements of the same type in the same arrangement if it leads to a reduction in the expenditure on manufacture and the overall volume or the expenditure on actuation.

Figure 5A:
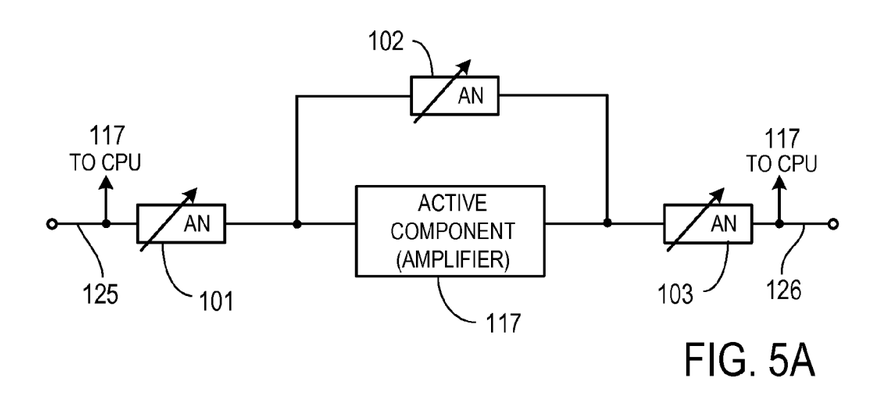
FIGS. 5a-5c show schematic circuit diagrams of exemplary embodiments of the present invention in which tunable adapter networks are connected to an amplifier (FIG. 5a), a mixer (FIG. 5b) and an oscillator (FIG. 5c)

FIG. 5a shows the case in which individually adjustable tuning networks 1, 2, 3 are connected in parallel (see tuning network 2) or serially (see tuning networks 1, 3) to an active component, which in this case is an amplifier 4.

Figure 5B:
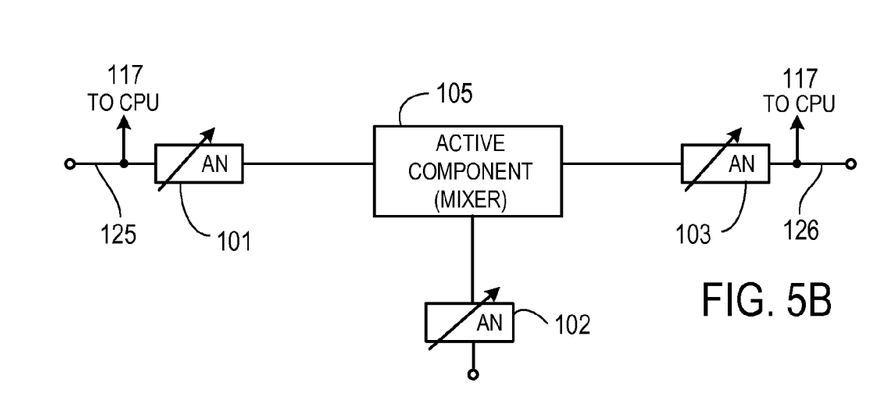

FIG. 5b shows the case in which three individually adjustable tuning networks 1, 2, 3 are connected to an active component 5, which in this case is a mixer.

Figure 5C:
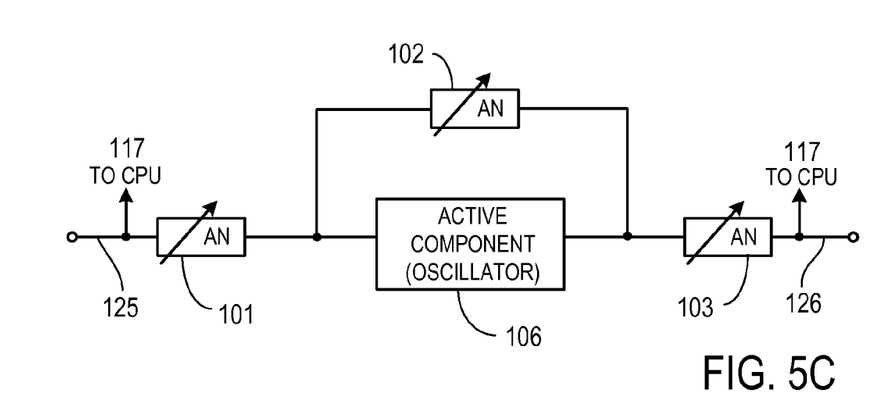

FIG. 5c shows the case in which three individually adjustable tuning networks 1, 2, 3 are connected to an active component 6 which is an oscillator 6.

Figure 6:
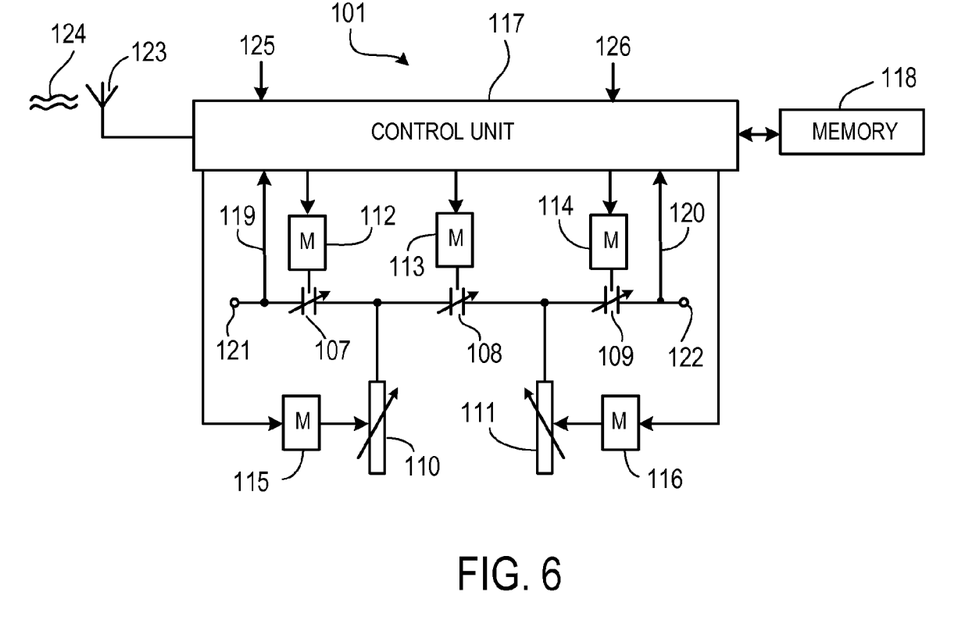
FIG. 6 shows a detailed view of a tunable adapter network according to the present invention.

FIG. 6 shows in detailed form the design of a tuning network 101, 102, 103 according to the present invention. The tuning network 101 which is illustrated as an exemplary embodiment has three capacitors 107, 108, 109 which are connected serially between an input 121 and an output 122 and whose capacitance value can be individually adjusted by mechanical means. Furthermore, two inductors or resonators 110, 111 are connected between the connecting point between the capacitor 107 and the capacitor 108 and between the capacitor 108 and the capacitor 109 and ground.

The capacitance values of the capacitors 107, 108, 109 can be set, for example, by sliding or rotating a metal plate of the capacitors by means of a micromotor. The characteristic values of the resonators or inductors 110, 111 can be set mechanically by displacing the grounding point.

Each of the adjustable passive components 107, 108, 109, 110, 111 is assigned an electric micromotor 112, 113, 114, 115, 116 which mechanically adjusts the characteristic values of the corresponding components. The micromotors 112, 113, 114, 115, 116 are actuated in this case by a control unit 217. The control unit 117 senses the signal response characteristics on the one hand of each adapter network 101, 102, 103 in which the signals which are present at the input 121 or the output 122 of each adapter network 101, 102, 103 are supplied to them at inputs 119, 120, and on the other hand the overall signal response characteristics of the RF block in which the control unit 117 is supplied with all the signals which are present at the input 125 or the output 126 of the RF block. The control unit 117 can thus
set all the individual passive components 107, 108, 109, 110, 111 of each mechanically tunable adapter network by means of the electric micromotors 112, 113, 114, 115 and 116 as a function of the signal response characteristics of each adapter network and/or of the RF block.

As is also clear in FIG. 6, the corresponding programming of the control unit 117 can also be carried out online over an air interface 124 and an antenna 123. That is to say, for example, a mobile phone in which a RF block according to the present invention is installed can be programmed online from a base station over the air interface 124 and the antenna 123.

As is also clear in FIG. 6, a memory 118 is connected to the control unit 117. This memory can be, for example, a PROM. Setting values for the individual passive components 107, 108, 109, 110, 111, i.e. the corresponding actuation values for the respectively assigned micromotors 112, 113, 114, 115 and 116 can be permanently stored in this memory 118. Furthermore, it is possible to provide in the memory 118 a table which specifies which individual setting values are required for the passive components in order to obtain predetermined signal response characteristics of the individual adapter networks 101, 102, 103 or of the RF block in its entirety.

Alternatively, the programmable control unit 117 can itself calculate the setting values, necessary to obtain a specific signal response characteristic of the RF block, for the mechanically tunable adapter network or networks.

The present invention therefore ensures complete programmability of a RF block for mobile phone applications. This provides a number of advantages. Firstly, owing to the use of purely passive components in the adapter networks, i.e. of mechanically tunable capacitors, coils and resonators, electrical power is consumed only during the actual setting period. As soon as the adapter network is set, the control unit 117 can, for example, switch off the electricity supply to the electric micromotors 112, 113, 114, 115, 116 in order to ensure that no electrical power whatsoever is consumed outside the aforesaid period. This is particularly important with battery-operated mobile phones.

By virtue of the fact that only passive components are used, there are fewer problems in terms of nonlinearity and distortion, in contrast to the case in which other active components such as, for example, varactors or transistors are used. Furthermore, the size of the circuit blocks can be kept small by using a compact layout and materials with a high dielectric constant. For example, components for this purpose can be constructed using a ceramic technology. This is in turn advantageous with mobile phones.

The method which is executed in order to set a programmable RF block according to the present invention will now be explained below. Firstly, the values of the mechanically adjustable capacitor, coil and/or resonator are selected by actuating a micromotor. The movement of the micromotor is controlled by means of software in the control unit 117. In this way, the adapter network is adapted specifically for the active component connected to it (transistor, diode, etc.) using a suitable combination of capacitors, coils and resonators. A suitable topology for the adapter network is selected for each circuit type. Finally, the signal response characteristics of each RF block in a mobile phone can be set and optimized by means of a calculation or an algorithm by changing the values of the adapter network components. The control data of the control unit 117 can be stored in the memory 118 and, if appropriate, reused when a new setting is made at a later time.

It is to be noted that the adapter network shown in FIG. 6 illustrates only one exemplary embodiment, and an adapter network according to the present invention can be constructed generally, for example, only as a capacitor but also as a complex combination of a cascade-shaped connection of capacitors, coils and resonators.

As already mentioned, all of the RF block is set with respect to its signal characteristics. When this is done, in particular the following parameters may be taken into consideration:
 a) Operating frequency at which the circuit (RF block) is to be operated,
 b) Bandwidth,
 c) Output power and amplification,
 d) Noise characteristics of the RF block.

In a circuit with a permanently predefined adapter network, the circuit parameters are predefined and can no longer be changed. The overall power achieved is thus a compromise between the various parameters.

Different applications of the present invention for different active components will now be explained in brief below.

For all types of amplifiers, mixers and oscillators, the operating frequency can be set by tuning the adapter network. The RF block can thus cover a wide frequency range in which, for example, a tunable broadband power amplifier, broadband mixer, etc. is implemented.

In all types of amplifiers and mixers, a large bandwidth can be adjusted to a smaller one and vice versa by tuning the adapter network. An overall improvement in the selectivity of the circuit can thus be obtained.

In all amplifiers with low noise it is possible to optimize a configuration to an optimum noise characteristic as a function of the strength of the input signal by tuning the adapter network, for example by adjusting the corresponding amplification factor. This improves, for example, the intermodulation property of the circuit.

In power amplifiers it is possible to tune with respect to the desired amplitude of the output signal or the efficiency by adjusting the adapter network. It is thus possible, for example, to prolong the service life of a battery of a mobile phone.

A programmable filter circuit according to the present invention will first be explained with reference to FIG. 7a.

Figure 7A:
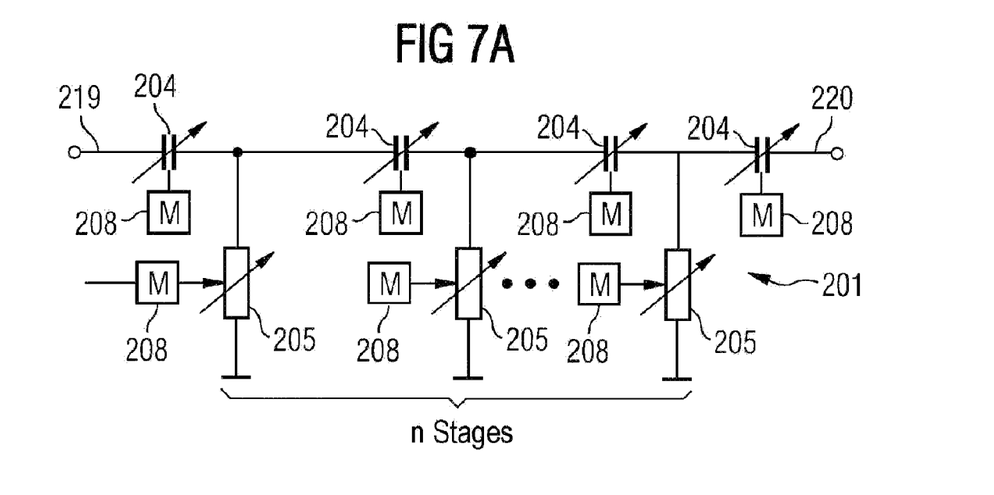
FIG. 7a shows a schematic circuit diagram of a programmable filter circuit according to the invention.

The filter circuit illustrated in FIG. 7a has an input 219 and an output 220. Adjustable capacitors 204 are connected in series between the input 219 and the output 220. The capacitors 204 here are each of the type whose capacitance value can be mechanically adjusted. To do this, in each case an electric micromotor 208 is assigned to a capacitor 204 with an adjustable capacitance. Of course, an electric micromotor can also be mechanically connected to more than one capacitor 204 in order to appropriately adjust the capacitance values of the capacitors connected to it.

In each case an inductor 205 or resonator is connected between the connection points between the individual capacitors 204 and ground. These inductors 205 are also mechanically adjustable, and to this, as in the case of the capacitors 204 in the illustrated exemplary embodiment, each electric micromotor 208 is assigned to one adjustable inductor 205 in each case. The filter circuit illustrated in FIG. 7a is, as is clear, a filter circuit with n stages.

The filter topology shown in FIG. 7a is the basis of the duplexer illustrated in FIG. 5b. The duplexer illustrated in FIG. 5b has, specifically, two filter circuits 202 and 203 which are connected to an antenna 206 by means of a common line from their input 219. The filter circuit 202 has n stages here and the filter circuit 203 m stages, n=m being possible. In order to provide a frequency multiplex mode (FDD) for example, the filter circuit 202 can be adjusted with respect to the passive components 204, 205 which form it, in such a way that its operating frequency differs from that of the filter circuit 203.

Figure 7B:
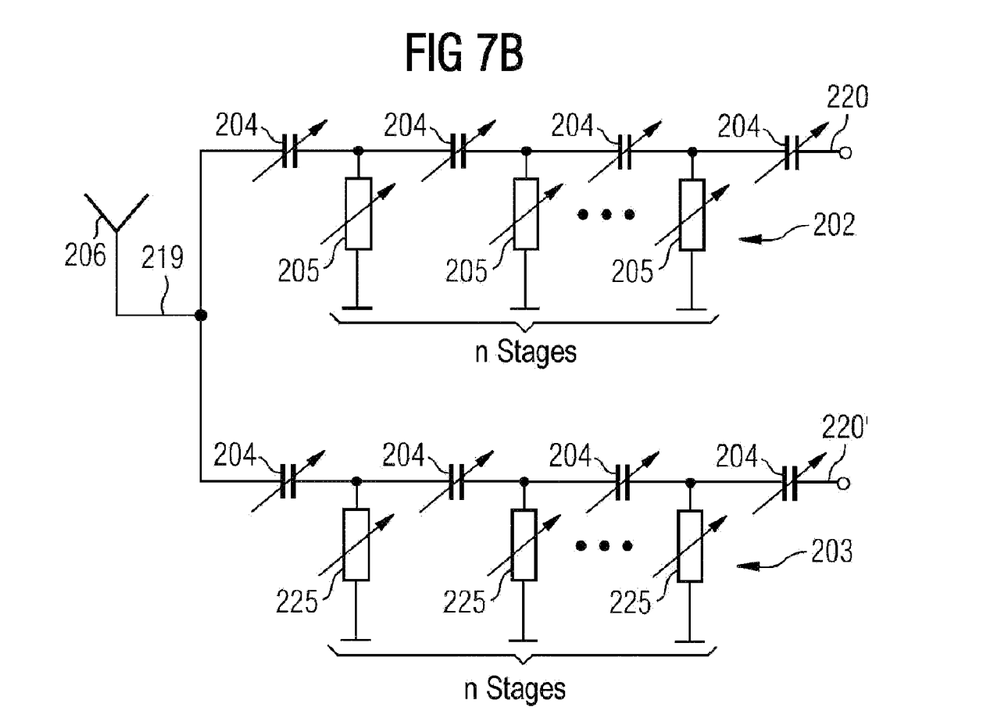
FIG. 7b shows a duplexer which has two programmable filter circuits whose components are adjusted in such a way that the filter circuits all have different frequency characteristic curves.

The programmable filter circuits 201 and 202, 203 (shown in FIGS. 7a and 7b) are based on a bandpass filter technology. However, it is clear that the present invention can also be applied to all other known filter technologies, for example low-pass or high-pass filters and notch filters.

Figure 8:
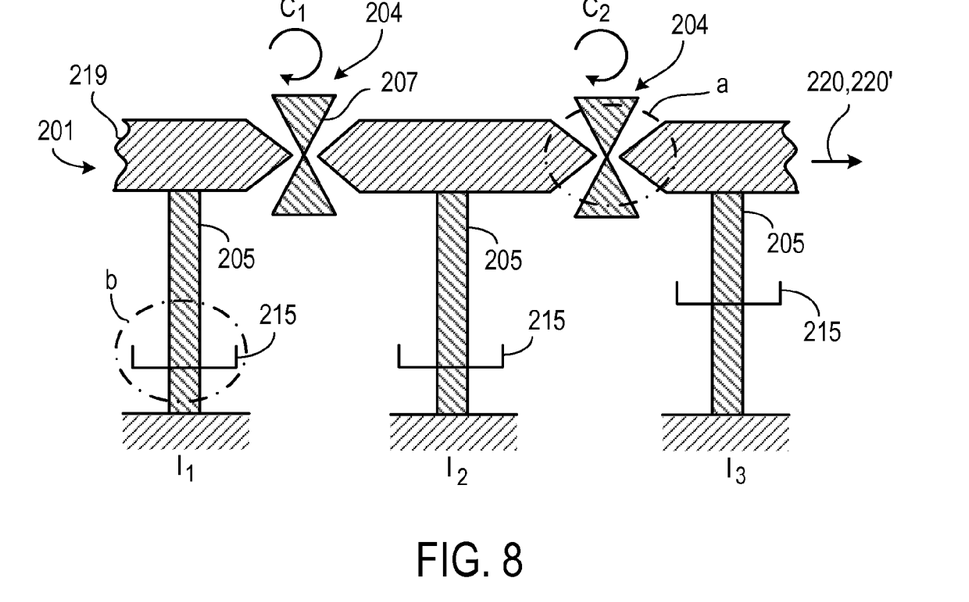
FIG. 8 shows an exemplary embodiment of the implementation of a filter circuit composed of capacitors and inductors/resonators whose characteristic values can be mechanically adjusted.

The detail shown in FIG. 8 includes two mechanically adjustable capacitors 204 in which in each case a metal disk 207 is rotated in order to adjust their capacitance.

Furthermore, FIG. 8 shows three inductors/resonators 5 whose effective length can be adjusted by displacing a short-circuit conductor 215 in order to change the corresponding characteristic values of the component.

Figure 9:
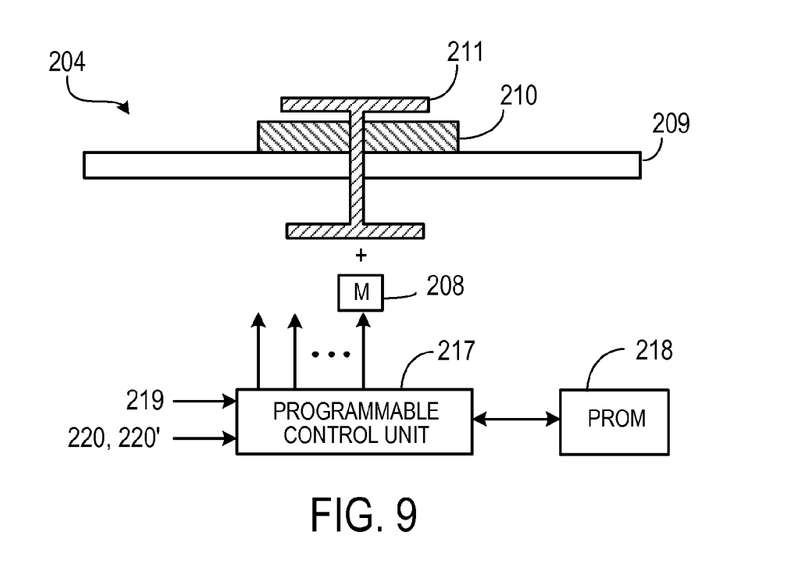
FIG. 9 shows a detail of FIG. 8 which is designated by a) in FIG. 2, FIG. 9 also illustrating the actuation in order to adjust the characteristic values of a capacitor.

FIG. 9 shows a detail from FIG. 8, which is designated in FIG. 8 by a). The mechanically adjustable capacitor 204 shown in FIG. 9 comprises essentially a metal plate 211, which is located above a dielectric 210 in a sandwich-like fashion and is in turn located above a printed circuit board (PCB) 209. The metal disk 211 of the capacitor 204 can be rotated by means of an electric micromotor 208 in order to mechanically change the capacitance of the capacitor 204.

The electric micromotor 208 is actuated here by a control unit 217. As is illustrated symbolically by arrows in FIG. 9, the control unit 217 can also adjust, by actuating a corresponding electric micromotor 208, a plurality of passive components, or all the passive components which are mechanically adjustable and which form the filter circuit 201 and 202, 203.

The control unit 217 carries out this adjustment of the individual components in such a way that the filter circuit has, in its entirety, a predetermined frequency characteristic curve between its input 219 and its output 220 and 220'. To do this, the control unit 217 is supplied, as information, with the signals which are present at the input 219 and at the output 220, 220' of the filter circuit, as is also indicated symbolically by arrows in FIG. 3. By means of the signals supplied from the input 219 and from the output 220, 220', the control unit 217 can acquire the frequency characteristic curve of the filter circuit and determine whether this actual frequency characteristic curve corresponds to a setpoint frequency characteristic curve.

As an alternative, the control unit 217 itself can calculate the actuation values for the electric micromotors 208 which are required to obtain a predetermined frequency characteristic curve. The frequency characteristic curve which is to be set can be stored in the control unit 217 itself or else also transmitted online to the control unit 217, for example by means of an air interface in the case of a mobile telephone.

As is also illustrated in FIG. 9, a PROM memory 218 is provided with the control unit 217. In the PROM memory 218, setting values or actuation values for the electric micromotors 208 and, if appropriate, predetermined frequency characteristic curves for the filter circuit can all be stored permanently in the form of a table. The control unit 217 can thus access the table stored in the PROM 218 in order to obtain a predetermined frequency characteristic curve of the filter circuit.

Figure 10:
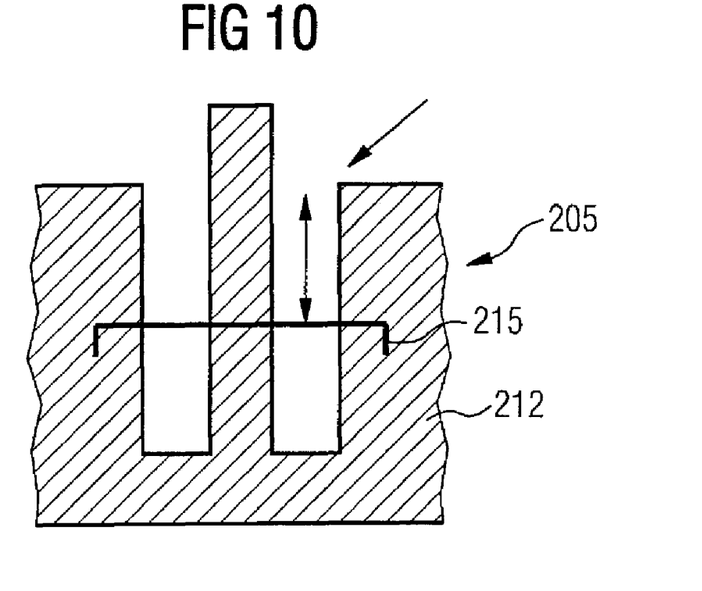
FIG. 10 shows a detail from FIG. 8 which shows the plan view of a line resonator whose electrical properties are changed by a short-circuit slide which is designated by b) in FIG. 8.

FIG. 10 shows a detail from FIG. 8 which is designated by b) in FIG. 8. In the exemplary embodiment illustrated in FIG. 10, the passive component is a resonator 205. By mechanically displacing a short-circuit conductor 205, actuated by an electric micromotor 208 in terms of its position with respect to the ground line 212, the characteristic values of the resonator 205 can be adjusted by the actuation of the control unit 217.

Figure 11:
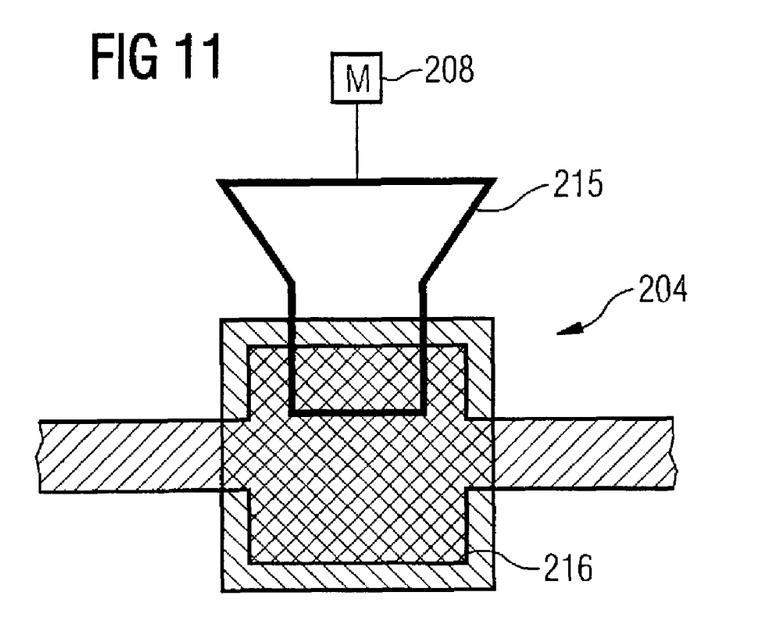
FIG. 11 shows a further exemplary embodiment for providing a capacitor whose capacitance value can be adjusted mechanically by a micromotor.

FIG. 11 shows a further exemplary embodiment of a mechanically adjustable capacitor 204. In this case, a metal plate 215 is displaced with respect to the dielectric 216 in a plane perpendicular to the plane of the dielectric 216, this displacement being carried out by means of an electric micromotor 208 that is in turn actuated by the control unit 217.

Of course, commercially available, tunable capacitor components can also be used for the programmed adjustment of the capacitance values of capacitors, it being possible for the adjustment to be carried out mechanically with an electric micromotor.

As is clear from the description of exemplary embodiments above, purely passive switching components are used in the present invention so that, on the one hand, the power consumption can be kept low and, on the other hand, nonlinearity problems, such as occur, for example, with yig or varactor technology, are avoided. In the programmable filter circuit according to the invention, electrical power is consumed only if a micromotor carries out an adjustment of a passive component. It is to be noted that according to the prior art electrical power is consumed continuously with pin-diode technology. As already stated, a PCB filter duplexer according to the present invention can be constructed using a ceramic technology which has a high dielectric constant, which leads to a reduction in the component dimensions.

It is to be noted that according to the prior art one or more micromotors with mechanical transmission are constructed in a very small form and can be integrated into the dimensions of a mobile unit.

It is to be noted that any known circuit topology which has a filter function or duplexer function can be used as a basis for the present invention. On this basis, the characteristic values of the adjustable (programmable) capacitor, the inductor or of a resonator can be changed in the circuit topology by means of a micromotor which can be in turn actuated electrically by means of a control unit.

By means of a calculation or a suitable algorithm it is then possible to change the characteristic values, such as the capacitance or the resonance value, for example, in such a way that the desired filter characteristic curve or duplexer characteristic curve is obtained with a desired center frequency and bandwidth.

LIST OF REFERENCE SYMBOLS

1 Mobile phone terminal
3 Baseband block
5 Receiver stage
7 Transmitter stage
9 Control stage
11 Duplexer
13 Antenna
15a, 15b Transmit-signal filter stage
17a, 17b Receive-signal filter stage
$C_1, C_2, C_3, C_4, C_5$ Capacitor
11, 12 Inductor
$MS_{i,j,k,l,m}$ Microswitch
$MM_1, MM_2$ Micromotor
90 Tuning controller
90a Tuning sequence controller
90b On/off switch
90c Inverter
90d Switch-configuration calculation stage
90f of Algorithm memory
90g Actuation signal generator
90h Program-end detector
C Controller
M Configuration memory
P Pointer stage
R/T RF section
S Control signal line
Sw On/off switch
101 Adapter network
102 Adapter network
103 Adapter network
104 Active component (amplifier)
105 Active component (mixer)
106 Active component (oscillator)
107 Capacitor
108 Capacitor
109 Capacitor
110 Inductor (coil)
111 Inductor (coil)
112 Micromotor
113 Micromotor
114 Micromotor
115 Micromotor
116 Micromotor
117 Control unit
118 Memory
119 Input of the control unit
120 Input of the control unit
121 Input terminal of the adapter network
122 Output terminal of the adapter network
123 Antenna
124 Air interface
125 Input of the control unit
126 Input of the control unit
201 Programmable filter circuit 202, 203 Programmable filter circuits of the duplexer
204 Adjustable capacitor
205 Adjustable inductor/resonator
206 Antenna
207 Metal disk
208 Electric micromotor
209 Printed circuit board
210 Dielectric
211 Metal disk
212 Grounding potential
215 Metal plate
216 Dielectric

The invention claimed is:

1. A mobile phone terminal comprising:
a transmitter stage;
a receiver stage;
an antenna switch-over and adapter stage, each having an arrangement of passive structural elements, wherein the arrangement is assigned via a multiplicity of electrostatic-mechanical microswitches or microrelays, and wherein the arrangement can be programmed by actuating a predetermined configuration of the microswitches or microrelays, in each case, in at least one functional parameter; and
a programmable control unit for actuating the microswitch or microrelay configuration for setting predetermined values of the functional parameter or the functional parameters.

2. The mobile phone terminal of claim 1, wherein the programmable control unit is programmable in response to a wireless signal.

3. The mobile phone terminal of claim 1, wherein the passive structural elements of the transmitter stage, receiver stage, and the antenna switch stage are integrated on a common substrate.

4. The mobile phone terminal of claim 3, wherein the common substrate has a high dielectric constant.

5. The mobile phone terminal of claim 3, further comprising at least one on/off switch for the transmitter stage and the receiver stage, wherein the control unit is programmed to transmit a switch-off signal to the at least one on/off switch, the switch-off signal for deactivating the transmitter stage and/or the receiver stage, and wherein the control unit is programmed to transmit the switch-off signal before the microswitches or the microrelays are actuated.

6. The mobile phone terminal of claim 5, wherein the control unit is programmed to transmit a switch-on signal to the at least one on/off switch, the switch-on signal for activating the transmitter stage and the receiver stage, and wherein the control unit is programmed to transmit the switch-on signal after termination of a program for determining a configuration of the microswitches or microrelays to set the at least one functional parameter.

7. The mobile phone terminal of claim 6, wherein the control unit further comprises algorithm memory for storing code to determine a value of the at least one functional parameter, and a calculation stage to determine a microswitch arrangement or a microrelay arrangement based, in part, on the value.

8. The mobile phone terminal of claim 7, wherein the calculation stage is configured to implement an algorithm to calculate an actuation signal for a micromotor, the actuation signal being used to obtain the determined value of the at least one functional parameter.

9. The mobile phone terminal of claim 7, further comprising memory to store a position and a topology that corresponds to actuator stages of the micromotor.

10. The mobile phone terminal of claim 1, wherein the at least one functional parameter includes a frequency characteristic.

11. The mobile phone terminal of claim 10, wherein the control unit comprises memory for storing data for switching matrices, and wherein switching matrices stored in the memory correspond to values associated with the frequency characteristic.

12. The mobile phone terminal of claim 11, wherein the control unit further comprises a stage to associate a set value of the frequency characteristic with a corresponding switching matrix, the control unit being programmable to actuate the microswitches or microrelays in accordance with the corresponding switching matrix.

13. The mobile phone terminal of claim 1, wherein the transmitter stage, the receiver stage, or the switch-over and adapter stage comprises a plurality of micromotors for mechanically configuring the passive structural elements in response to at least one control signal from the control unit.

* * * * *

UNITED STATES PATENT AND TRADEMARK OFFICE
CERTIFICATE OF CORRECTION

| | | |
|---|---|---|
| PATENT NO. | : 8,045,933 B2 | Page 1 of 1 |
| APPLICATION NO. | : 12/491509 | |
| DATED | : October 25, 2011 | |
| INVENTOR(S) | : Bernd Bienek et al. | |

It is certified that error appears in the above-identified patent and that said Letters Patent is hereby corrected as shown below:

On the face page, in field (63), Related U.S. Application Data, in column 1, line 3, delete "7,570,943." and insert -- 7,570,973. --, therefor.

Signed and Sealed this
Tenth Day of July, 2012

David J. Kappos
*Director of the United States Patent and Trademark Office*